United States Patent
Chang et al.

(10) Patent No.: US 9,362,125 B2
(45) Date of Patent: Jun. 7, 2016

(54) SEMICONDUCTOR PROCESS

(71) Applicant: United Microelectronics Corp., Hsinchu (TW)

(72) Inventors: Yuan-Hsiang Chang, Hsinchu (TW); Yi-Shan Chiu, Taoyuan County (TW); Zhen Chen, Singapore (SG); Wei Ta, Singapore (SG); Wei-Chang Liu, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 34 days.

(21) Appl. No.: 14/454,332

(22) Filed: Aug. 7, 2014

(65) Prior Publication Data

US 2016/0042957 A1    Feb. 11, 2016

(51) Int. Cl.
*H01L 21/28* (2006.01)
*H01L 29/66* (2006.01)
*H01L 29/792* (2006.01)
*H01L 27/115* (2006.01)

(52) U.S. Cl.
CPC .... *H01L 21/28282* (2013.01); *H01L 27/11563* (2013.01); *H01L 29/66833* (2013.01); *H01L 29/792* (2013.01)

(58) Field of Classification Search
CPC ................ H01L 21/28282; H01L 29/4234; H01L 29/66833; H01L 29/792
See application file for complete search history.

(56) References Cited

U.S. PATENT DOCUMENTS

| | | | |
|---|---|---|---|
| 6,946,349 B1 | 9/2005 | Lee et al. | |
| 8,228,726 B2 | 7/2012 | Fang et al. | |
| 2005/0093047 A1* | 5/2005 | Goda | H01L 27/105 257/300 |
| 2013/0178031 A1* | 7/2013 | Ramkumar | H01L 21/823412 438/287 |

* cited by examiner

*Primary Examiner* — Thanhha Pham
(74) *Attorney, Agent, or Firm* — J.C. Patents

(57) ABSTRACT

A semiconductor process is described. A semiconductor substrate having a memory area, a first device area and a second device area is provided. A patterned charge-trapping layer is formed on the substrate, covering the memory area and the second device area but exposing the first device area. A first gate oxide layer is formed in the first device area. The charge-trapping layer in the second device area is removed. A second gate oxide layer is formed in the second device area.

17 Claims, 2 Drawing Sheets

SEMICONDUCTOR PROCESS

BACKGROUND OF THE INVENTION

1. Field of Invention

This invention relates to a semiconductor process, and particularly relates to a semiconductor process for integrated fabrication of memory cells and other devices.

2. Description of Related Art

In order to improve the speed of data storage and reading, memory cells and other devices may be integrated in the same chip.

When the memory cells are charge-trapping non-volatile memory cells and need a charge-trapping layer under the gates, the gate dielectric layer of other devices needs a separate step to form. Moreover, in cases where the other devices include two kinds of devices, such as high-voltage (HV) devices and low-voltage (LV) devices, their gate dielectric layers may be formed separately to create two gate dielectric thicknesses.

In a conventional method for forming such structure, an ONO layer as a charge-trapping layer required by the memory area is formed, the portions of the ONO layer in the HV device area and LV device area are removed, a thicker gate oxide layer required by the HV devices is formed in the exposed HV device area and LV device area, the portion of the thicker gate oxide layer in the LV device area is removed, and then a thinner gate oxide layer is formed in the exposed LV device area.

However, for the thicker gate oxide layer required by the HV devices has ever been formed in the LV device area that is smaller, the stress caused by growing the thicker gate oxide layer may induce defects in the substrate of the LV device area. The substrate defects will cause device leakage problems.

SUMMARY OF THE INVENTION

In view of the foregoing, this invention provides a semiconductor process for integrated fabrication of memory cells and other devices.

The semiconductor process of this invention is described. A semiconductor substrate having a memory area, a first device area and a second device area is provided. A patterned charge-trapping layer is formed on the substrate, covering the memory area and the second device area but exposes the first device area. A first gate oxide layer is formed in the first device area. The charge-trapping layer in the second device area is removed. A second gate oxide layer is formed in the second device area.

In some embodiments of this invention, the thickness of the first gate oxide layer is greater than the thickness of the second gate oxide layer. Such embodiments include an embodiment where the first device area comprises a high-voltage (HV) device area and the second device area comprises a low-voltage (LV) device area.

In an embodiment, the charge-trapping layer comprises a silicon oxide/silicon nitride/silicon oxide (ONO) composite layer, and the memory area is for forming silicon/silicon oxide/silicon nitride/silicon oxide/silicon (SONOS) memory cells.

In embodiments where the thickness of the first gate oxide layer is greater than the thickness of the second gate oxide layer, because the first gate oxide layer required by the first device area is never formed in the second device area due to the masking by the charge-trapping layer, the first gate oxide layer that is thicker does not cause a stress in the substrate in the second device area to form defects in the same.

In order to make the aforementioned and other objects, features and advantages of the present invention comprehensible, a preferred embodiment accompanied with figures is described in detail below.

DESCRIPTION OF EMBODIMENTS

This invention will be further explained with the following embodiment and the accompanying drawings, which are not intended to restrict the scope of this invention. For example, although the memory area is for forming SONOS memory cells in the following embodiment, it may alternatively be for forming memory cells of another type, such as SONONOS memory cells or SNNNS memory cells, etc. Moreover, although the first device area is a high-voltage (HV) device area and the second device area is a low-voltage (LV) device area in the following embodiment, the combination of the first device area and the second device area in this invention may alternatively be a different combination of device areas requiring different gate oxide thicknesses.

FIGS. 1 to 8 schematically illustrate, in a cross-sectional view, a semiconductor process according to an embodiment of this invention.

Figure 1:
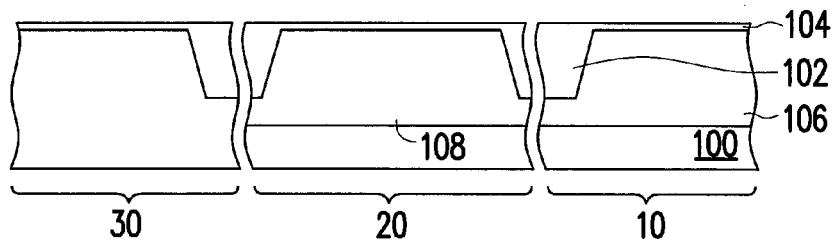
FIGS. 1 to 8 schematically illustrate, in a cross-sectional view, a semiconductor process according to an embodiment of this invention.

Referring to FIG. 1, a semiconductor substrate 100, such as a lightly doped Si-substrate, is provided. An isolation layer 102, such as a shallow trench isolation (STI) layer, is then formed in the substrate 100 to define a memory area 10, a HV device area 20 and a LV device area 30. The HV devices to be formed in the HV device area 20 may include peripheral input/output (IO) devices. The LV devices to be formed in the LV device area 30 may include CMOS logic/analog devices.

A screen layer 104, such as a silicon oxide layer, is then formed over the substrate 100, covering the memory area 10, the HV device area 20 and the LV device area 30. A first well 106 required by the memory cells to be formed in the memory area 10 is formed in the substrate 100 in the memory area 10 by ion implantation through the screen layer 104. A second well 108 required by the HV devices to be formed in the HV device area 20 is formed in the substrate 100 in the HV device area 20 by ion implantation through the screen layer 104.

Figure 2:
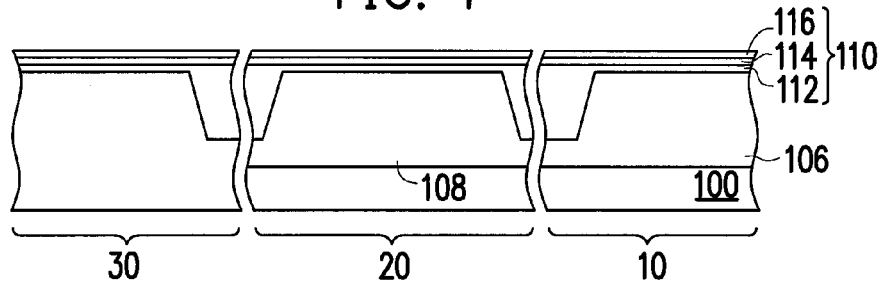

Referring to FIG. 2, after the screen layer 104 is removed, a pre-patterned charge-trapping layer 110 is formed over the substrate 100, covering the memory area 10, the HV device area 20 and the LV device area 30. The pre-patterned charge-trapping layer 110 may be an ONO composite layer, and may be formed by steps including forming a bottom silicon oxide layer 112, forming a silicon nitride (SiN) layer 114 on the bottom silicon oxide layer 112, and forming a top silicon oxide layer 116 on the SiN layer 114.

The bottom silicon oxide layer 112 may be formed through in-situ steam generation (ISSG) oxidation of a surface layer of the substrate 100. The ISSG oxidation may be conducted at a temperature in the range of 900° C. to 1000° C., preferably at about 950° C. The bottom silicon oxide layer 112 may have a thickness in the range of 40 to 60 Å, preferably about 50 Å.

The SiN layer 114 may be formed through furnace deposition, and may have a thickness in the range of 75 to 95 Å, preferably about 85 Å.

The top silicon oxide layer 116 may be formed through in-situ steam generation (ISSG) oxidation or thermal oxidation of a surface layer of the silicon nitride layer 114, and may have a thickness in the range of 65 to 85 Å, preferably about 75 Å.

Figure 3:
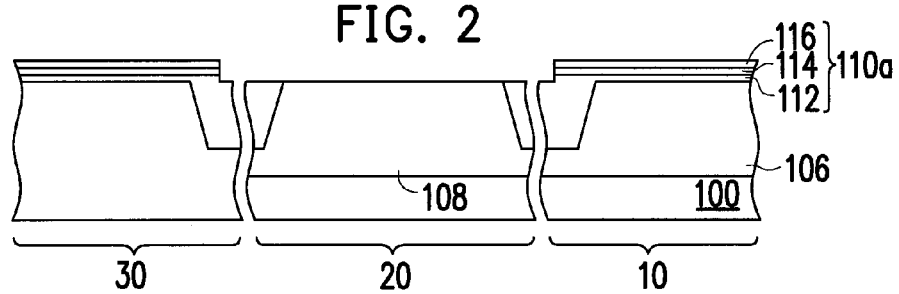

Referring to FIG. 3, the pre-patterned charge-trapping layer 110 in the HV device area 20 is removed, possibly through lithography and etching, to form a patterned charge-trapping layer 110a covering the memory area 10 and the LV device area 30 but exposing the HV device area 20.

Figure 4:
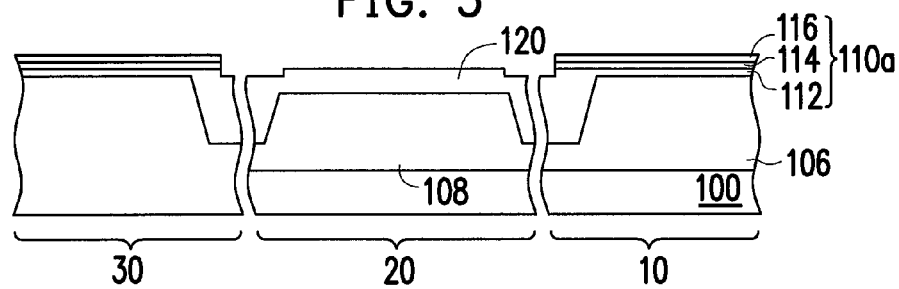

Referring to FIG. 4, a gate oxide layer 120 is formed on the substrate 100 in the HV device area 20 exposed by the trapping layer 110a. The gate oxide layer 120 has a relatively large thickness, possibly in the range of 160 to 180 Å and preferably about 170 Å, to match the high operation voltage of the HV devices. The first gate oxide may be formed with a dry oxidation method or a wet oxidation method. The dry oxidation method may include thermal oxidation. The wet oxidation method may include ISSG oxidation. The temperature set in the wet oxidation method may range from 800° C. to 900° C., preferably at about 850° C.

Since the LV device area 30 is covered by the charge-trapping layer 110a, the thick gate oxide layer 120 causing a relatively large stress is not formed in the LV device area 30 of which the dimension is smaller so that defects easily form due to a larger stress. Hence, the thick gate oxide layer 120 required by the HV devices does not cause defects in the substrate 100 in the LV device area 30.

Figure 5:
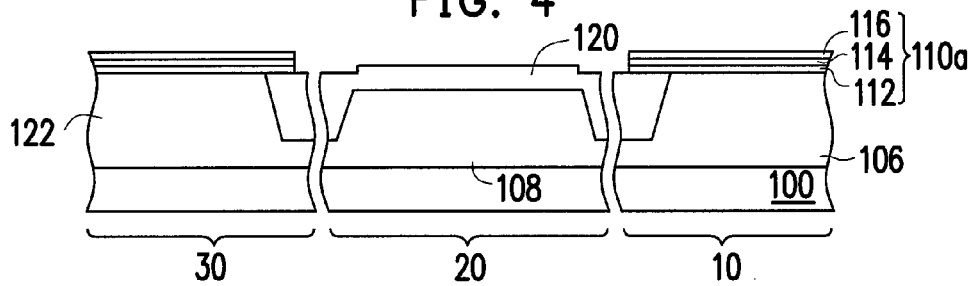

Referring to FIG. 5, a well 122 required by LV devices is formed in the substrate 100 in the LV device area 30 by ion implantation, through the charge-trapping layer 110a. The well 122 is formed using the charge-trapping layer 110a as a screen layer, so that a channel effect is prevented in the ion implantation process.

Figure 6:
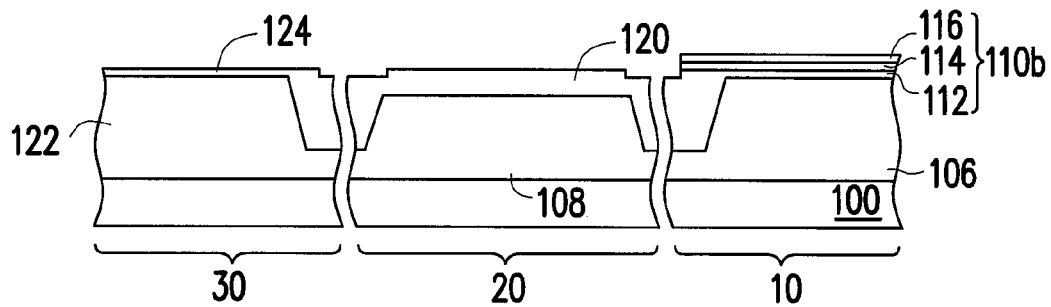

Referring to FIG. 6, the charge-trapping layer 110a in the LV device area 30 is removed, so that the remaining charge-trapping layer 110b is in the memory area 10 only. A gate oxide layer 124 required by the LV devices is then formed on the exposed substrate 100 in the LV device area 30. The gate oxide layer 124 has a relatively small thickness, possibly in the range of 20 to 40 Å, depending on the low operation voltage of the LV devices. The gate oxide layer 124 may be formed through ISSG oxidation and subsequent decoupled plasma nitridation (DPN).

Figure 7:
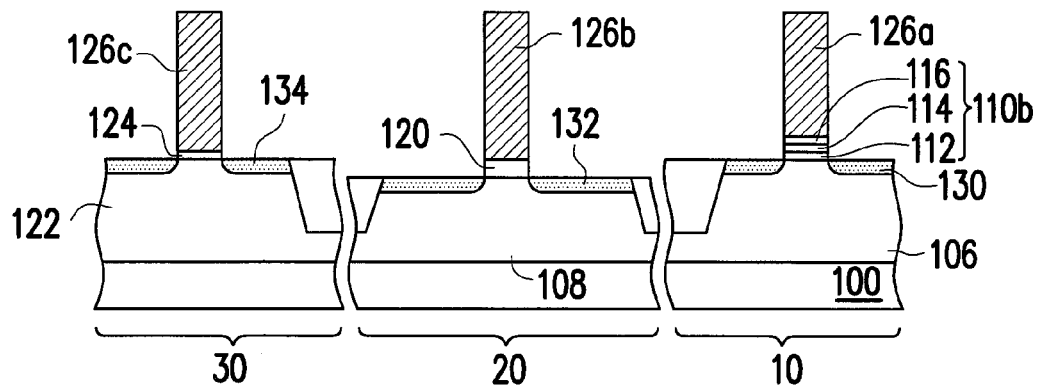

Referring to FIG. 7, a plurality of gates 126a, 126b and 126c are formed in the memory area 10, the HV device area 20 and the LV device area 30, including the gates 126a of the memory cells to be formed in the memory area 10, the gates 126b of the HV devices to be formed in the HV device area 20, and the gates 126c of the LV devices to be formed in the LV device area 30. Thereafter, S/D regions 130 of the memory cells are formed in the substrate 100 beside the gate 126a in the memory area 10, S/D extension regions 132 of the HV devices are formed in the substrate 100 beside the gate 126b in the HV device area 20, and S/D extension regions 134 of the LV devices are formed in the substrate 100 beside the gate 126c in the LV device area 30.

Figure 8:
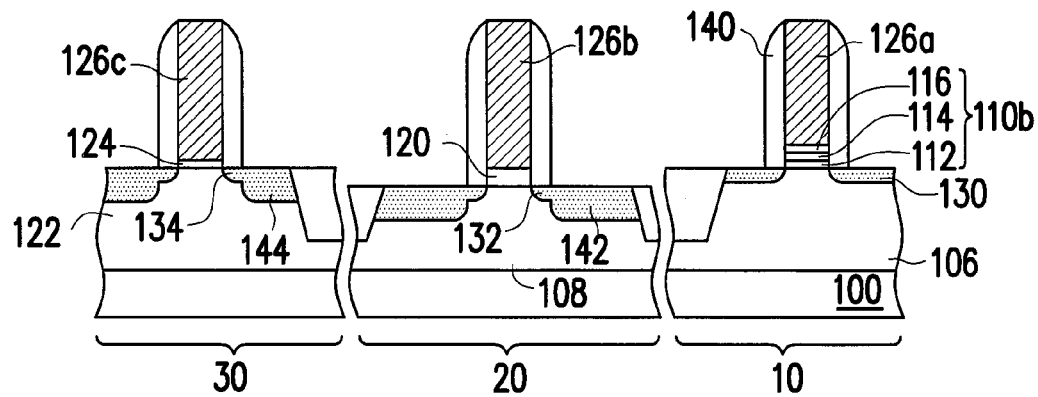

Referring to FIG. 8, a plurality of spacers 140 are formed on the sidewalls of the gates 126a, 126b and 126c. Thereafter, S/D regions 142 of the HV devices are formed in the substrate 100 beside the spacer 140 of the gate 126b, and S/D regions 144 of the LV devices are formed in the substrate 100 beside the spacer 140 of the gate 126c.

Because the thick gate oxide layer 120 formed for the HV devices does not cause defects in the substrate 100 in the LV device area 30 as mentioned above, the LV device formed as shown in FIG. 8 does not suffer from current leakage and other stress-related problems caused by the thick gate oxide layer 120 formed for the HV devices.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A semiconductor process, comprises:
    providing a semiconductor substrate having a memory area, a first device area and a second device area;
    forming, over the semiconductor substrate, a patterned charge-trapping layer that covers the memory area and the second device area but exposes the first device area;
    forming a first gate oxide layer in the first device area;
    forming a first well in the semiconductor substrate in the second device area through the patterned charge-trapping layer in the second device area after the first gate oxide layer is formed;
    removing the charge-trapping layer in the second device area after the first well is formed; and
    forming a second gate oxide layer in the second device area.

2. The semiconductor process of claim 1, wherein a thickness of the first gate oxide layer is greater than a thickness of the second gate oxide layer.

3. The semiconductor process of claim 2, wherein the first device area comprises a high-voltage (HV) device area and the second device area comprises a low-voltage (LV) device area.

4. The semiconductor process of claim 3, wherein the first gate oxide layer is formed with a dry oxidation method.

5. The semiconductor process of claim 3, wherein the first gate oxide layer is formed with a wet oxidation method.

6. The semiconductor process of claim 3, wherein the second gate oxide layer is formed through in-situ steam generation (ISSG) oxidation and subsequent decoupled plasma nitridation (DPN).

7. The semiconductor process of claim 1, wherein the charge-trapping layer comprises a silicon oxide/silicon nitride/silicon oxide (ONO) composite layer, and the memory area is for forming silicon/silicon oxide/silicon nitride/silicon oxide/silicon (SONOS) memory cells.

8. The semiconductor process of claim 1, further comprising, after the second gate oxide layer is formed, forming a plurality of gates in the memory area, the first device area and the second device area.

9. The semiconductor process of claim 8, further comprising forming a plurality of spacers on sidewalls of the gates.

10. The semiconductor process of claim 8, further comprising forming, for each gate, source/drain (S/D) regions in the semiconductor substrate beside the gate.

11. The semiconductor process of claim 1, wherein forming the patterned charge-trapping layer comprises:
    forming a pre-patterned charge-trapping layer covering the memory area, the first device area and the second device area; and
    removing the pre-patterned charge-trapping layer in the first device area.

12. The semiconductor process of claim 11, wherein forming the pre-patterned charge-trapping layer comprises:
    forming a bottom silicon oxide layer;
    forming a silicon nitride layer on the bottom silicon oxide layer; and
    forming a top silicon oxide layer on the silicon nitride layer.

13. The semiconductor process of claim 12, wherein the bottom silicon oxide layer is formed through in-situ steam generation (ISSG) oxidation.

14. The semiconductor process of claim 12, wherein the silicon nitride layer is formed through furnace deposition.

15. The semiconductor process of claim 12, wherein the top silicon oxide layer is formed through in-situ steam generation (ISSG) oxidation or thermal oxidation.

16. The semiconductor process of claim 11, further comprising, after the semiconductor substrate is provided but before the pre-patterned charge-trapping layer is formed,
- forming a screen layer covering the memory area, the first device area and the second device area;
- forming, through the screen layer, a second well and a third well respectively in the semiconductor substrate in the first device area and in the semiconductor substrate in the memory area; and
- removing the screen layer.

17. The semiconductor process of claim 16, wherein the screen layer comprises silicon oxide.

* * * * *